(12) United States Patent
Takasu et al.

(10) Patent No.: US 7,898,035 B2
(45) Date of Patent: Mar. 1, 2011

(54) SEMICONDUCTOR DEVICE

(75) Inventors: Hiroaki Takasu, Chiba (JP); Sukehiro Yamamoto, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 12/315,635

(22) Filed: Dec. 4, 2008

(65) Prior Publication Data
US 2009/0152633 A1 Jun. 18, 2009

(30) Foreign Application Priority Data
Dec. 12, 2007 (JP) .............................. 2007-320973

(51) Int. Cl.
*H01L 23/62* (2006.01)
(52) U.S. Cl. .................. 257/355; 257/173; 257/356; 257/360; 257/363; 257/E29.015; 257/E29.008; 438/155
(58) Field of Classification Search ................ 257/758, 257/355, 356, 324, 358, 357, 359, 360, 361, 257/363, 364, E29.008, E29.015, E29.023, 257/107, 173, 452, E27.016, E27.06, E29.013, 257/E29.029, E27.009, E21.09, E25.024; 438/155
See application file for complete search history.

(56) References Cited

U.S. PATENT DOCUMENTS

| | | | |
|---|---|---|---|
| 5,910,675 A * | 6/1999 | Horiguchi et al. ........... 257/370 |
| 6,940,131 B2 * | 9/2005 | Baldwin et al. ............. 257/355 |
| 2005/0023692 A1 * | 2/2005 | Matsunaga et al. .......... 257/758 |
| 2005/0041169 A1 * | 2/2005 | Hashimoto et al. ........... 349/43 |
| 2005/0077551 A1 * | 4/2005 | Halamik et al. ............. 257/262 |
| 2005/0224883 A1 * | 10/2005 | Huang et al. ................ 257/355 |
| 2007/0034960 A1 * | 2/2007 | Zhang et al. ................ 257/360 |
| 2007/0235809 A1 * | 10/2007 | Hayano ...................... 257/355 |
| 2009/0152633 A1 * | 6/2009 | Takasu et al. ............... 257/360 |

OTHER PUBLICATIONS

Patent Abstracts of Japan, publication No. 07-045829, publication date Feb. 14, 1995.

* cited by examiner

*Primary Examiner*—Lynne A Gurley
*Assistant Examiner*—Yosef Gebreyesus
(74) *Attorney, Agent, or Firm*—Adams & Wilks

(57) ABSTRACT

A semiconductor device has a silicon substrate, an external connection terminal disposed on the silicon substrate, an internal circuit region disposed on the silicon substrate, an NMOS transistor for electrostatic discharge protection provided between the external connection terminal and the internal circuit region, and a wiring connecting together the external connection terminal and the NMOS transistor and connecting together the NMOS transistor and the internal circuit region. The NMOS transistor has a drain region and a gate electrode whose potential is fixed to a ground potential. The external connection terminal is smaller than the drain region and is formed above the drain region.

7 Claims, 3 Drawing Sheets

SEMICONDUCTOR DEVICE

BACKGROUND OF THE INVENTION

1. Field of the Invention

The present invention relates to a semiconductor device including an electrostatic discharge (ESD) protective element formed between an external connection terminal and an internal circuit region so as to protect an internal element formed in the internal circuit region from an ESD breakdown.

2. Description of the Related Art

In a semiconductor device including a metal oxide semiconductor (MOS) transistor, a so-called off transistor, whose gate potential is fixed to a ground (Vss) to hold an off-state in case of an n-type MOS (NMOS) transistor, is used as an ESD protective element for preventing a breakdown of an internal circuit due to static electricity invading from a PAD terminal for external connection. In order to prevent an ESD breakdown of an internal element, it is important to draw as much part of an electrostatic pulse as possible into the off transistor to inhibit the electrostatic pulse from propagating to the internal element, or to change a fast and large electrostatic pulse into a slow and small signal before transmitted to the internal element.

However, the off transistor needs to flow a large amount of current caused by the drawn static electricity at one time unlike the MOS transistors forming the internal circuit such as a logic circuit, thus the transistor width W is designed to have as large as several hundred micrometers in many cases. As a result, a large occupation area is needed for the off transistor, preventing the total area reduction especially in a small integrated circuit (IC) chip, also becoming a factor for increase in cost of the entire IC.

Further, in many cases, the off transistor often takes a form in which a plurality of drain regions, source regions, and gate electrodes are combined in a comb shape. This structure involving the combination of a plurality of transistors has a difficulty in uniform operation in the entire NMOS transistor for ESD protection. For example, current concentration caused in a portion closer to the external connection terminal may result in the breakdown of the off transistor without sufficient exertion of the original ESD protection function.

As a countermeasure against the above-mentioned problems, there is proposed an invention in which a distance between a contact hole formed on a drain region and a gate electrode is made smaller as a distance from the external connection terminal becomes longer to accelerate the operation of the transistor (for example, refer to FIG. 2 of JP 7-45829 A).

However, when the width W is made smaller for the purpose of a smaller occupation area of the off transistor, the protection function can not be sufficiently accomplished. Further, in the method of JP 7-45829 A, the distance between the contact hole in the drain region and the gate electrode is adjusted, to thereby locally adjust a transistor operation speed. However, the method has problems that a desired contact width cannot be ensured along with a reduction in width of the drain region, and that wiring resistance has been made low through wiring structure including a refractory metal in recent years to thereby accelerate a propagation speed of surge, causing a case in which the transistor operation speed cannot be adjusted only by the distance between the contact hole and the gate electrode. Further, in JP 7-45829 A, there is not disclosed a method for drawing as much part of the electrostatic pulse as possible into the off transistor without propagating the electrostatic pulse to the internal element, or a remedial measure for changing a fast and large electrostatic pulse into a slow and small signal before transmission, in order to prevent the ESD breakdown of the internal element.

SUMMARY OF THE INVENTION

In order to solve the problems described above, a semiconductor device according to the present invention is configured as follows.

In the semiconductor device including an NMOS transistor for ESD protection having a gate whose potential is fixed to a ground potential disposed between an external connection terminal and an internal circuit region, the external connection terminal is formed above a drain region of the NMOS transistor for ESD protection.

Further, the drain region of the NMOS transistor for ESD protection is surrounded by a source region of the NMOS transistor for ESD protection through a channel region of the NMOS transistor for ESD protection. Besides, the drain region has a shape with rounded corners in plan view.

Further, element isolation between the NMOS transistor for ESD protection and another element is performed by a shallow trench isolation structure. Besides, the external connection terminal is formed of a plurality of wiring layers laminated above the drain region of the NMOS transistor for ESD protection. Moreover, wiring between the external connection terminal and the internal element and wiring between the NMOS transistor for ESD protection and the internal element are formed of a metal material containing a refractory metal.

With those structures, the NMOS transistor for ESD protection can be formed in a small occupation area. Besides, the most possible part of the electrostatic pulse can be drawn into the off transistor in order not to propagate to the internal element to prevent the ESD breakdown of the internal element, or a fast and large electrostatic pulse can be changed into a slow and small signal before transmission. Accordingly, it is possible to obtain a semiconductor device including an ESD protective element capable of performing a sufficient ESD protection function with a small occupation area.

DETAILED DESCRIPTION OF THE PREFERRED EMBODIMENTS

First Embodiment

Figure 1:
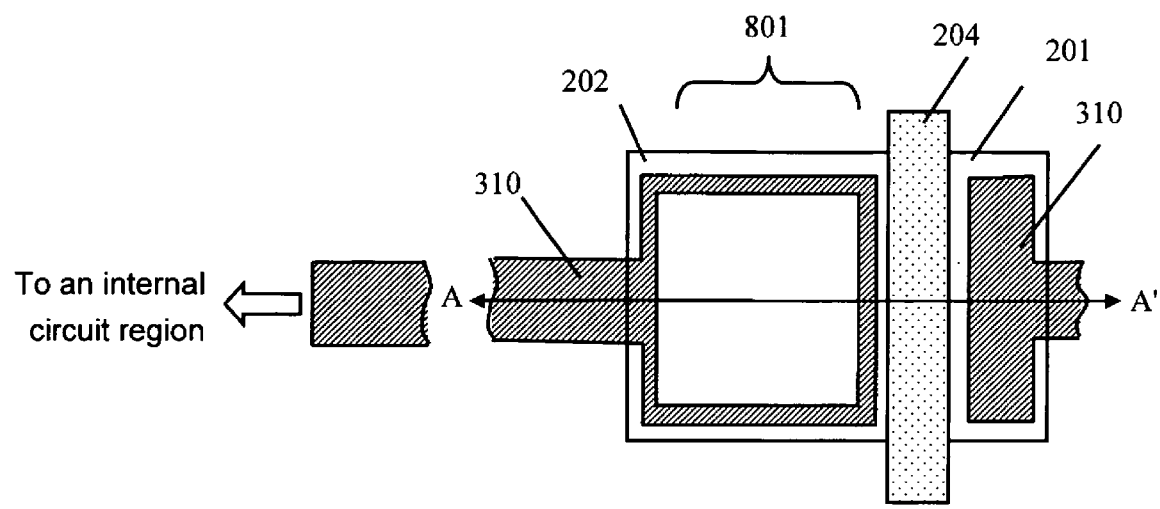
FIG. 1 is a schematic plan view illustrating an NMOS transistor for ESD protection of a semiconductor device according to a first embodiment of the present invention.

FIG. 1 is a schematic plan view illustrating an NMOS transistor for ESD protection of a semiconductor device according to a first embodiment of the present invention.

A source region 201 and a drain region 202 formed of an n-type heavily-doped impurity region are formed, and between the source region 201 and the drain region 202, a gate electrode 204 is disposed on a gate insulating film (not shown) formed of an insulating film such as a silicon oxide film, thereby forming an NMOS transistor for ESD protection. An external connection terminal region 801 is formed above the drain region 202. First metal wiring 310 located directly below the external connection terminal region 801 is connected to the drain region 202 of the NMOS transistor for ESD protection through contact holes (not shown) and is extended to an internal region. Further, potentials of the source region 201 and the gate electrode 204 are fixed to a ground potential, taking a configuration of a so-called off transistor.

In an example of FIG. 1, the external connection terminal region 801 is formed directly above the drain region 202 of the NMOS transistor for ESD protection, and in plan view, takes a shape in which a part of an ESD protective element region includes an external connection terminal. Accordingly, the ESD protective element can be formed in a smaller occupation area compared with the conventional counterpart.

Here, the external connection terminal region 801 is formed only above the drain region 202 of the NMOS transistor for ESD protection so as not to overlap the gate electrode 204. The external connection terminal region 801 is a region which is used for performing an electrical measurement through probing in a testing process or other processes conducted later, and for mounting the IC chip into a resin package through wire bonding or the like. The region has a risk of being exposed to stress, tension, damage, or the like through probing or wire bonding. The gate electrode 204 and the gate insulating film disposed therebelow are main portions which determine characteristics of the NMOS transistor, and are extremely sensitive and vulnerable to mechanical stresses. In the present invention, the external connection terminal region 801 is provided only above the drain region 202 but not above the gate electrode 204, constituting a feature of the present invention.

The external connection terminal region 801 is formed above the drain region 202 of the NMOS transistor for ESD protection, and is directly connected to the drain region 202 through the contact holes. For this reason, a resistance value between the external connection terminal and the ESD protective element becomes considerably smaller compared with a resistance value between the ESD protective element and the internal element. Accordingly, an ESD surge or an electrostatic pulse can be preferentially drawn onto the protective element side, and with the use of resistance of wiring toward the internal element, a fast and large electrostatic pulse can be transmitted to the internal element not by being propagated as it is, but by being changed into a slow and small signal.

The embodiment of FIG. 1 illustrates an example of the NMOS transistor for ESD protection, in which the gate electrode 204 is disposed along one direction (side) of the external connection terminal region 801, but the present invention is not limited thereto. The gate electrode 204 may be disposed along two sides to four sides of the external connection terminal region 801.

Figure 2:
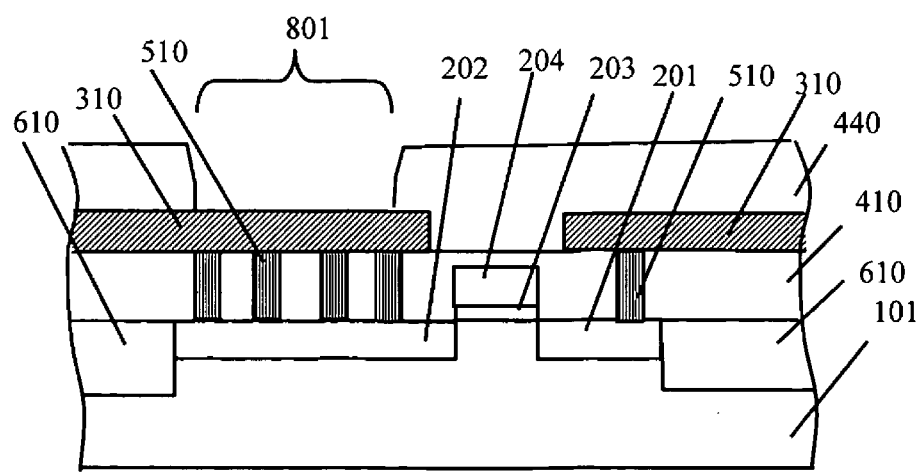
FIG. 2 is a schematic cross-sectional view taken along a line A-A' of the NMOS transistor for ESD protection according to the first embodiment.

FIG. 2 is a schematic cross-sectional view taken along a line A-A' of FIG. 1 in the first embodiment.

The source region 201 and the drain region 202 formed of an n-type heavily-doped impurity region are formed on a p-type silicon substrate 101, and the gate electrode 204 is disposed on a part of the p-type silicon substrate 101 located between the source region 201 and the drain region 202 through a gate insulating film 203 formed of an insulating film such as a silicon oxide film, thereby forming the NMOS transistor for ESD protection. Further, a shallow trench isolation region 610 serving as an element isolation region is formed outside the source region 201 and the drain region 202.

In this case, the potentials of the source region 201 and the gate electrode 204 are fixed to the ground potential (not shown) to take the configuration of the so-called off transistor. Further, the first metal wiring 310 formed of aluminum containing a refractory metal is formed above the source region 201 and the drain region 202 through a first insulating film 410. A large number of contact holes 510 are provided in the first insulating film 410 formed on the drain region 202 so as to electrically connect the first metal wiring 310 to the drain region 202. The large number of contact holes 510 formed on the drain region 202 are widely distributed and disposed almost over the entire drain region 202. This is because, in the case where the NMOS transistor for ESD protection functions to receive the ESD surge and let out a current through a bipolar operation, the operation is prevented from occurring locally.

Since the NMOS transistor for ESD protection has to handle a large current for performing a protection function, a large channel width W is assigned to. However, in the case where, for example, the contact holes 510 are provided locally, full use of the large channel width is impossible, and the operation is limited to a partial region. In some cases, local concentration of the large current causes a breakdown, whereby a desired ESD tolerance cannot be exerted. Wide distribution and dense disposition of a large number of contact holes 510 over the entire drain region 202 enable uniform operation of the NMOS transistor for ESD protection 710 on the whole against an incoming electrostatic pulse, permitting effective treatment (release) of the electrostatic pulse with the entire channel width.

The first metal wiring 310 connected to the drain region 202 forms the external connection terminal region 801 above the drain region 202, and is extended to the internal region. Further, the source region 201 is connected to the first metal wiring 310 through the contact hole 501, and is fixed to the ground potential (not shown) along with the gate electrode 204. A protection film 440 formed of a silicon-nitride film or the like is formed on the first metal wiring 310, and a part of the protection film 440 is removed above the drain region 202, whereby the external connection terminal region 801 in which the first metal wiring 310 is exposed is formed. In this manner, the external connection terminal region 801 is formed directly above the drain region 202 of the NMOS transistor for ESD protection. The reason for this formation and an effect thereof are made previously in the description of FIG. 1.

Second Embodiment

Figure 3:
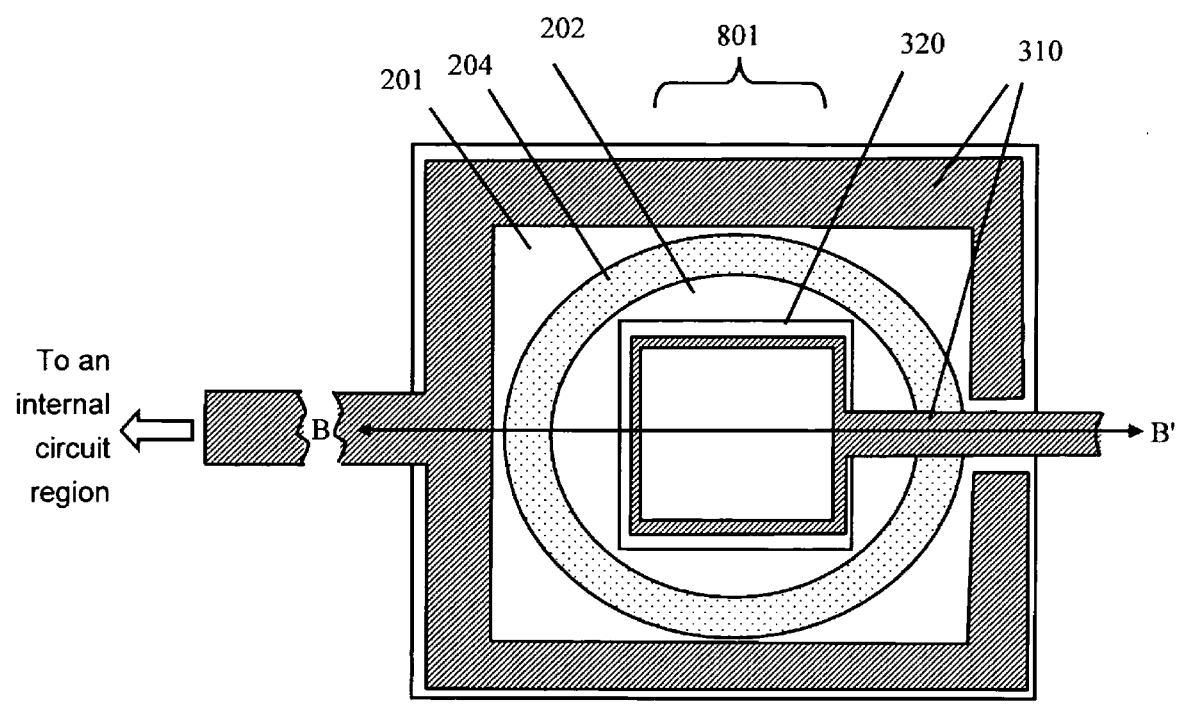
FIG. 3 is a schematic plan view illustrating an NMOS transistor for ESD protection of a semiconductor device according to a second embodiment of the present invention.

FIG. 3 is a schematic plan view illustrating an NMOS transistor for ESD protection of a semiconductor device according to a second embodiment of the present invention.

A drain region 202 formed of an n-type heavily doped impurity region has a substantially circular contour defined by a gate electrode 204, and has a planar shape surrounded by a source region 201 through the gate electrode 204. The gate electrode 204 is disposed between the drain region 202 and the source region 201 on a gate insulating film (not shown) formed of an insulating film such as a silicon oxide film, to thereby form an NMOS transistor for ESD protection. First metal wiring 310 is disposed above the drain region 202, connected to the drain region 202 of the NMOS transistor for ESD protection through contact holes (not shown), and extended to an internal region.

Further, the first metal wiring 310 is connected to second metal wiring 320 through via holes (not shown) above the drain region 202, and an external connection terminal region 801 is formed. The potentials of the source region 201 and the gate electrode 204 are fixed to a ground potential, and take the configuration of the so-called off transistor. In this case, the drain region 202 has the substantially circular contour defined by the gate electrode 204 and has a planar shape surrounded by the source region 201 through the gate electrode 204. The reasons for the above are to separate the drain region 202 from an element isolation region, and to avoid formation of corners at which currents concentrate.

In general, when shallow trench isolation is adopted for element isolation, in many cases, a leak current resulting from a crystal defect or the like is generated in a portion adjacent to another element. In particular, this is likely to become a serious problem in the case of an NMOS transistor for ESD protection having a large transistor width W.

In the present invention, the drain region of the NMOS transistor for ESD protection is apart from the element isolation region, and the drain region is entirely surrounded by the source region through the gate electrode, whereby an increase in leak current, which becomes a problem particularly in the shallow trench isolation, can be prevented. Moreover, since the planar shape of the drain region has no corner, a local breakdown due to the current concentration can be prevented to ensure a sufficient ESD tolerance against an incoming surge.

In the second embodiment illustrated in FIG. 3, the drain region 202 has a substantially circular shape. However, it is aimed here to relieve the current concentration, and thus the drain region 202 may have a substantially oblong shape, or may have a general rectangular shape in which corner portions are rounded. Further, the case where the external connection terminal region 801 has a rectangular shape is described, but the external connection terminal region 801 may have a substantially circular shape in accordance with the shape of the drain region 202. Considering a probing step or the like performed later, there is a case where the circular shape is superior to the rectangular shape from the viewpoint of securing equal margins with respect to displacement at probing in all orientations. The contact holes and the via holes also need to be widely distributed and disposed in accordance with the shape of the external connection terminal region 801.

Also in the second embodiment illustrated in FIG. 3, as in the first embodiment illustrated in FIG. 1, the external connection terminal region 801 is formed directly above the drain region 202 of the NMOS transistor for ESD protection, and in plan view, has a shape in which a part of the ESD protective element region includes the external connection terminal. For this reason, the ESD protective element can be formed in a smaller occupation area compared with the conventional counterpart. Further, also in this embodiment, as in the first embodiment, the external connection terminal region 801 is formed only above the drain region 202 of the NMOS transistor for ESD protection so as not to overlap the gate electrode 204. The reason for the above and its explanation are similar to those of the first embodiment illustrated in FIG. 1.

In the second embodiment illustrated in FIG. 3, the external connection terminal region 801 is formed by the second metal wiring 320 formed directly above the drain region 202 of the NMOS transistor for ESD protection. In this case, the example of employing multilayer wiring for formation of a semiconductor device is described, and the present invention is not limited to two-layer metal wiring. In the second embodiment, the external connection terminal region 801 is formed above the drain region 202 of the NMOS transistor for ESD protection, and is directly connected to the drain region 202 through the via holes and the contact holes. For this reason, a resistance value between the external connection terminal and the ESD protective element becomes considerably smaller compared with a resistance value between the ESD protective element and the internal element. Accordingly, the ESD surge or electrostatic pulse can be preferentially drawn onto the protective element side. Besides, with the use of, for example, resistance of the wiring toward the internal element, a fast and large electrostatic pulse does not propagate to the internal element as it is, but can be changed to a slow and small signal before transmission to the internal element.

Figure 4:
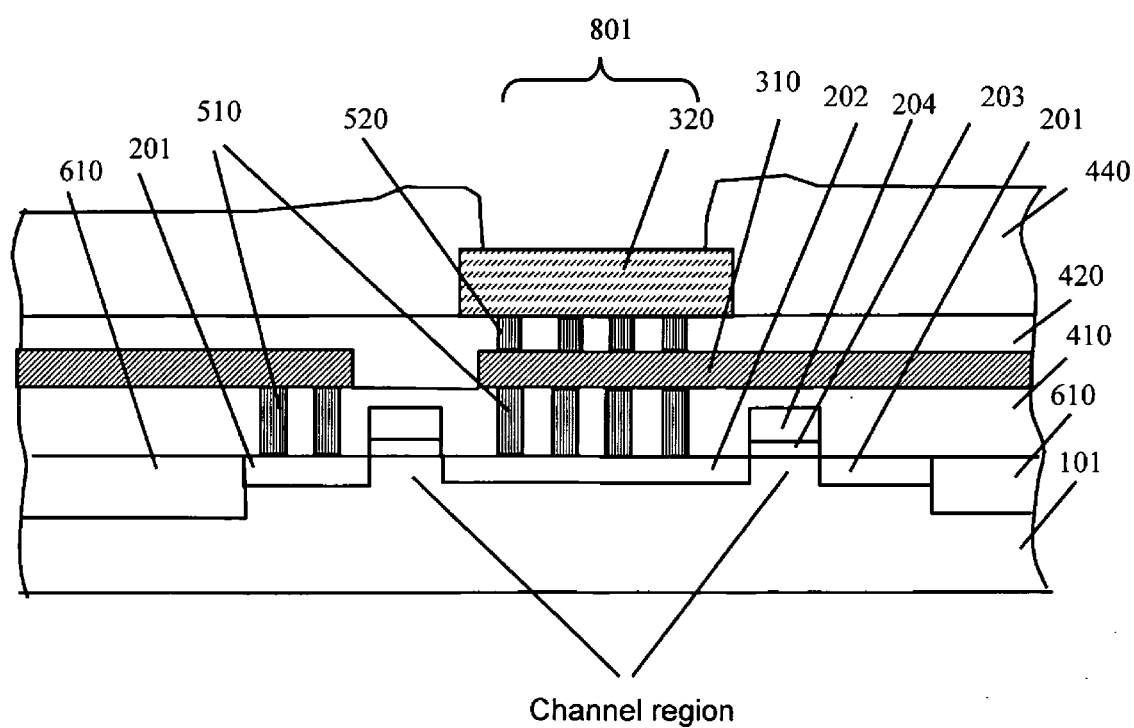
FIG. 4 is a schematic cross-sectional view taken along a line B-B' of the NMOS transistor for ESD protection according to the second embodiment.

FIG. 4 is a schematic cross-sectional view taken along a line B-B' of FIG. 3 in the second embodiment.

The source region 201 and the drain region 202 formed of an n-type heavily-doped impurity region are formed on a p-type silicon substrate 101, and the gate electrode 204 is disposed on a part of the p-type silicon substrate 101 located between the source region 201 and the drain region 202 through a gate insulating film 203 formed of an insulating film such as a silicon oxide film, thereby forming the NMOS transistor for ESD protection. Here, a periphery of the drain region 202 is surrounded by the source region 201 through a part of the p-type silicon substrate 101 serving as a channel region of the NMOS transistor. Further, a shallow trench isolation region 610 serving as an element isolation region is formed outside the source region 201 and the drain region 202.

In this case, the potentials of the source region 201 and the gate electrode 204 are fixed to the ground potential (not shown) to take the configuration of the so-called off transistor. Further, the first metal wiring 310 formed of aluminum containing a refractory metal is formed above the source region 201 and the drain region 202 through a first insulating film 410. A large number of contact holes 510 are provided in the first insulating film 410 formed on the drain region 202 so as to electrically connect the first metal wiring 310 to the drain region 202. Further, a large number of contact holes 510 formed on the drain region 202 are widely distributed and densely disposed almost over the entire drain region 202 to prevent local and partial operation of the NMOS transistor for ESD protection 710 during capture of the ESD surge and release of the current through a bipolar operation.

Since the NMOS transistor for ESD protection has to handle a large current for performing a protection function, a large channel width W is assigned to. However, in the case where, for example, the contact holes 510 are provided locally, full use of the large channel width is impossible, and the operation is limited to a partial region. In some cases, local concentration of the large current causes a breakdown, whereby a desired ESD tolerance cannot be exerted. Wide distribution and dense disposition of a large number of contact holes 510 over the entire drain region 202 enable uniform operation of the NMOS transistor for ESD protection 710 on the whole against an incoming electrostatic pulse, permitting effective treatment (release) of the electrostatic pulse with the entire channel width.

The second metal wiring 320 formed of, for example, aluminum containing a refractory metal is formed above the first metal wiring 310 located above the drain region 202 through a second insulating film 420, and is connected to the first metal wiring 310 through a large number of via holes 520. The first metal wiring 310 connected to the drain region 202 is connected to the second metal wiring 320 through the via holes above the drain region 202 to form the external connection terminal region 801, and is extended to the internal region. Further, the source region 201 is connected to the first metal wiring 310 through the contact holes 510, and is fixed to the ground potential (not shown) along with the gate electrode 204. A protection film 440 formed of a silicon nitride film or the like is formed around the second metal wiring 320, and a part of the protection film 440 is removed above the drain region 202, whereby the external connection terminal region 801 in which the second metal wiring 320 is exposed is formed.

In this manner, the external connection terminal region 801 is formed directly above the drain region 202 of the NMOS transistor for ESD protection. The reason for this formation and an effect thereof are similar to those of FIG. 1 and FIG. 2.

As described above, according to the present invention, the NMOS transistor for ESD protection can be formed in a small occupation area. Besides, the most possible part of the electrostatic pulse can be drawn into the off transistor in order not to propagate to the internal element to prevent the ESD breakdown of the internal element, or a fast and large electrostatic pulse can be changed into a slow and small signal before transmission. Accordingly, it is possible to obtain a semiconductor device including an ESD protective element capable of performing a sufficient ESD protection function with a small occupation area.

What is claimed is:

1. A semiconductor device comprising:
   a silicon substrate;
   an external connection terminal disposed on the silicon substrate;
   an internal circuit region disposed on the silicon substrate;
   an NMOS transistor for electrostatic discharge protection provided between the external connection terminal and the internal circuit region, the NMOS transistor having a drain region, a channel region, a source region surrounding the drain region through the channel region, and a gate electrode whose potential is fixed to a ground potential, the external connection terminal being smaller than the drain region and being formed above the drain region; and
   a wiring connecting together the external connection terminal and the NMOS transistor and connecting together the NMOS transistor and the internal circuit region.

2. A semiconductor device according to claim 1; wherein the drain region has a circular shape in plan view.

3. A semiconductor device according to claim 1; further comprising a shallow trench isolation structure disposed around the NMOS transistor and apart from the drain region of the NMOS transistor.

4. A semiconductor device comprising:
   a silicon substrate:
   an external connection terminal disposed on the silicon substrate;
   an internal circuit region disposed on the silicon substrate; and
   an NMOS transistor for electrostatic discharge protection provided between and connected to each of the external connection terminal and the internal circuit region, the NMOS transistor having a drain region, a channel region, a source region surrounding the drain region through the channel region, and a gate electrode having a potential fixed to a ground potential, the external connection terminal being smaller than the drain region and being formed above the drain region so as not to overlap the gate electrode.

5. A semiconductor device according to claim 4; wherein the drain region has a circular shape in plan view.

6. A semiconductor device according to claim 4; further comprising a shallow trench isolation structure disposed around the NMOS transistor and in spaced-apart relation to the drain region of the NMOS transistor.

7. A semiconductor device comprising:
   a silicon substrate;
   an external connection terminal disposed on the silicon substrate:
   an internal circuit region disposed on the silicon substrate:
   an NMOS transistor for electrostatic discharge protection provided between and connected to each of the external connection terminal and the internal circuit region, the NMOS transistor having a drain region, a source region, and a gate electrode having a potential fixed to a ground potential, the external connection terminal being smaller than the drain region and being formed above the drain region so as not to overlap the gate electrode; and
   a shallow trench isolation structure disposed around the NMOS transistor and in spaced-apart relation to the drain region of the NMOS transistor.

* * * * *